(12) United States Patent
Tiburzi et al.

(10) Patent No.: US 9,916,880 B2
(45) Date of Patent: *Mar. 13, 2018

(54) APPARATUSES, CIRCUITS, AND METHODS FOR BIASING SIGNAL LINES

(71) Applicant: Micron Technology, Inc., Boise, ID (US)

(72) Inventors: Marco-Domenico Tiburzi, Avezzano (IT); Giulio-Giuseppe Marotta, Contigliano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/474,353

(22) Filed: Mar. 30, 2017

(65) Prior Publication Data

US 2017/0206942 A1    Jul. 20, 2017

Related U.S. Application Data

(63) Continuation of application No. 14/989,678, filed on Jan. 6, 2016, now Pat. No. 9,646,662, which is a continuation of application No. 13/651,093, filed on Oct. 12, 2012, now Pat. No. 9,236,102.

(51) Int. Cl.
*G11C 7/00* (2006.01)
*G11C 7/12* (2006.01)
*G11C 8/10* (2006.01)
*G11C 5/14* (2006.01)
(Continued)

(52) U.S. Cl.
CPC .............. *G11C 7/12* (2013.01); *G11C 5/141* (2013.01); *G11C 5/148* (2013.01); *G11C 7/22* (2013.01); *G11C 8/10* (2013.01); *G11C 11/56* (2013.01)

(58) Field of Classification Search
CPC .... G11C 7/12; G11C 7/22; G11C 8/10; G11C 11/56; G11C 5/141; G11C 5/148
See application file for complete search history.

(56) References Cited

U.S. PATENT DOCUMENTS

| 4,792,928 A | 12/1988 | Tobita |
| 4,884,238 A | 11/1989 | Lee et al. |
| 4,926,387 A | 5/1990 | Madland |

(Continued)

FOREIGN PATENT DOCUMENTS

| EP | 1526548 A1 | 4/2005 |
| WO | 2014130315 A1 | 8/2014 |

OTHER PUBLICATIONS

U.S. Appl. No. 13/775,868, filed Feb. 25, 2013, pp. all.

(Continued)

*Primary Examiner* — Toan Le
(74) *Attorney, Agent, or Firm* — Dorsey & Whitney LLP

(57) ABSTRACT

Apparatuses, circuits, and methods are disclosed for biasing signal lines in a memory array. In one such example the memory array includes a signal line coupled to a plurality of memory cells and is configured to provide access to the plurality of memory cells responsive to a biasing condition of the signal line. The memory array also includes a signal line driver coupled to the signal line, the signal line driver configured to provide a biasing signal to the signal line and to provide a preemphasis in the biasing signal responsive to a control signal. The control signal is responsive to an operating condition.

20 Claims, 6 Drawing Sheets

(51) Int. Cl.
*G11C 11/56* (2006.01)
*G11C 7/22* (2006.01)

(56) References Cited

U.S. PATENT DOCUMENTS

| | | | |
|---|---|---|---|
| 5,062,079 | A | 10/1991 | Tsuchida et al. |
| 5,130,580 | A | 7/1992 | Min et al. |
| 5,663,925 | A | 9/1997 | Vo |
| 6,088,279 | A | 7/2000 | Ishii |
| 6,181,626 | B1 | 1/2001 | Brown |
| 6,356,481 | B1 | 3/2002 | Micheioni et al. |
| 6,359,821 | B1 | 3/2002 | Roohparvar |
| 6,411,557 | B2 | 6/2002 | Terizoglu et al. |
| 6,456,557 | B1 | 9/2002 | Dadashev et al. |
| 6,490,199 | B2 | 12/2002 | Lee et al. |
| 6,857,449 | B1 | 2/2005 | Chow |
| 6,914,836 | B2 | 7/2005 | Jeon et al. |
| 7,099,204 | B1 | 8/2006 | Wadhwa et al. |
| 7,366,040 | B2 | 4/2008 | Chen |
| 7,414,904 | B2 | 8/2008 | Ehrenreich et al. |
| 7,450,427 | B2 | 11/2008 | Yamada |
| 7,529,135 | B2 | 5/2009 | Pan et al. |
| 7,577,049 | B1 | 8/2009 | Kornachuk |
| 7,706,201 | B2 | 4/2010 | Liaw et al. |
| 7,724,075 | B2 | 5/2010 | Yang et al. |
| 7,936,626 | B2 | 5/2011 | Chen |
| 7,990,773 | B2 | 8/2011 | Tran et al. |
| 8,040,723 | B2 | 10/2011 | Sheu et al. |
| 8,050,084 | B2 | 11/2011 | Bae et al. |
| 8,159,869 | B2 | 4/2012 | Park et al. |
| 8,228,709 | B2 | 7/2012 | Choi et al. |
| 8,254,180 | B2 | 8/2012 | Moei et al. |
| 8,358,540 | B2 | 1/2013 | Nguyen |
| 8,743,587 | B2 * | 6/2014 | Takase ................ G11C 8/005 365/148 |
| 8,767,494 | B2 | 7/2014 | Yang et al. |
| 8,824,191 | B2 | 9/2014 | Samachisa et al. |
| 8,885,399 | B2 | 11/2014 | Storms et al. |
| 9,042,190 | B2 | 5/2015 | Vimercati et al. |
| 9,105,328 | B2 | 8/2015 | Chiu et al. |
| 9,236,102 | B2 | 1/2016 | Tiburzi et al. |
| 9,368,202 | B2 | 6/2016 | Vimercati et al. |
| 9,418,716 | B1 | 8/2016 | Palleria et al. |
| 9,576,654 | B2 | 2/2017 | Vimercati et al. |
| 9,646,662 | B2 | 5/2017 | Tiburzi et al. |
| 9,672,875 | B2 | 6/2017 | Park |
| 2003/0086304 | A1 | 5/2003 | Park |
| 2004/0174150 | A1 | 9/2004 | Zhang et al. |
| 2005/0117399 | A1 | 6/2005 | Kwon et al. |
| 2006/0081944 | A1 | 4/2006 | Madan |
| 2006/0181915 | A1 | 8/2006 | Oh et al. |
| 2006/0245260 | A1 | 11/2006 | Kim |
| 2006/0256620 | A1 | 11/2006 | Nguyen et al. |
| 2007/0002618 | A1 | 1/2007 | Schoenauer et al. |
| 2007/0109862 | A1 | 5/2007 | Kim et al. |
| 2007/0140003 | A1 | 6/2007 | Ido |
| 2007/0211537 | A1 | 9/2007 | Park et al. |
| 2007/0258276 | A1 | 11/2007 | Higashitani |
| 2008/0037327 | A1 | 2/2008 | Park et al. |
| 2008/0043555 | A1 | 2/2008 | Hold |
| 2008/0089130 | A1 | 4/2008 | Park |
| 2008/0123436 | A1 | 5/2008 | Byeon |
| 2008/0205134 | A1 | 8/2008 | Kato |
| 2009/0003067 | A1 | 1/2009 | Kang et al. |
| 2009/0003077 | A1 | 1/2009 | Lim |
| 2009/0040833 | A1 | 2/2009 | Shin et al. |
| 2009/0052256 | A1 | 2/2009 | Sutardja |
| 2009/0080275 | A1 | 3/2009 | Vo et al. |
| 2009/0135651 | A1 | 5/2009 | Kojima et al. |
| 2009/0161411 | A1 | 6/2009 | Kushida et al. |
| 2009/0161433 | A1 | 6/2009 | Lee et al. |
| 2009/0168537 | A1 | 7/2009 | Kim |
| 2010/0027320 | A1 | 2/2010 | Muraoka et al. |
| 2010/0054064 | A1 | 3/2010 | Miyakawa et al. |
| 2010/0061162 | A1 | 3/2010 | Burnett et al. |
| 2010/0067308 | A1 | 3/2010 | Tran et al. |
| 2010/0110798 | A1 | 5/2010 | Hoei et al. |
| 2010/0214846 | A1 | 8/2010 | Kim et al. |
| 2010/0246259 | A1 | 9/2010 | Kwon |
| 2011/0032746 | A1 | 2/2011 | Maejima et al. |
| 2011/0063920 | A1 | 3/2011 | Moschiano et al. |
| 2011/0235398 | A1 | 9/2011 | Hosono |
| 2011/0292725 | A1 | 12/2011 | Choi et al. |
| 2012/0008384 | A1 | 1/2012 | Li et al. |
| 2012/0075931 | A1 | 3/2012 | Yuh |
| 2012/0087172 | A1 | 4/2012 | Aoki |
| 2012/0218817 | A1 | 8/2012 | Kang et al. |
| 2013/0051147 | A1 | 2/2013 | Iwai |
| 2013/0155770 | A1 | 6/2013 | Hirano |
| 2013/0163320 | A1 * | 6/2013 | Lam ................ G11C 13/0004 365/163 |
| 2013/0201769 | A1 | 8/2013 | Yang |
| 2013/0242671 | A1 | 9/2013 | Missiroli |
| 2014/0010032 | A1 | 1/2014 | Seshadri et al. |
| 2014/0064010 | A1 | 3/2014 | Barkley et al. |
| 2014/0104922 | A1 | 4/2014 | Tiburzi et al. |
| 2014/0160856 | A1 | 6/2014 | Joo |
| 2014/0185361 | A1 | 7/2014 | Oh et al. |
| 2014/0241049 | A1 | 8/2014 | Vimercati et al. |
| 2014/0347912 | A1 | 11/2014 | Siau et al. |
| 2015/0213848 | A1 | 7/2015 | Park |
| 2015/0294717 | A1 | 10/2015 | Vimercati et al. |
| 2016/0118096 | A1 | 4/2016 | Tiburzi et al. |
| 2016/0254049 | A1 | 9/2016 | Vimercati et al. |
| 2017/0270976 | A1 | 9/2017 | Park |

OTHER PUBLICATIONS

Choi, Youngdon et al., "A 20nm 1.8V 8Gb PRAM with 40MB/s Program Bandwidth", IEEE International ISSCC 2012, Session 2, Feb. 2012, pp. all.

Son, Young-Suk et al., "A Gray-Level Dependent Pre-Emphasis Column Driver with Fast Settling for Active-Matrix LCD Application", IEEE Transactions on Circuits and Systems—II: Express Briefs, vol. 54, No. 12, Dec. 2007, pp. all.

U.S. Appl. No. 15/610,281, entitled "Methods and Apparatuses for Providing a Program Voltage Responsive to a Voltage Determination", filed May 31, 2017, pp. all.

* cited by examiner

APPARATUSES, CIRCUITS, AND METHODS FOR BIASING SIGNAL LINES

CROSS REFERENCE TO RELATED APPLICATIONS

This application is a continuation of U.S. patent application Ser. No. 14/989,678 filed Jan. 6, 2016 and issued as U.S. Pat. No. 9,646,662 on May 9, 2017, which is a continuation of U.S. application Ser. No. 13/651,093 filed Oct. 12, 2012 and issued as U.S. Pat. No. 9,236,102 on Jan. 12, 2016. These applications are incorporated herein by reference in their entirety and for any purpose.

TECHNICAL FIELD

Embodiments of the invention relate generally to integrated circuits, and more particularly, in one or more of the illustrated embodiments, to biasing signal lines in a memory array.

BACKGROUND OF THE INVENTION

Various signal lines in memory frequently need to be biased to achieve a particular condition on the signal lines in order to perform a memory operation. For example, a word line or a bit line may need to be biased to have a particular voltage before a read or a write operation can be performed. In today's memory systems, however, signal lines can be relatively long and relatively close to one another, which may result in an unacceptable propagation delay between when a biasing signal is provided to one end of the signal line and when a target (e.g., desired) condition is achieved along the remainder of the signal line. With reference to the timing diagram 101 in FIG. 1, a biasing voltage V-INPUT may be provided to an input node of a signal line at time T0. If the voltage along the signal line is measured at several measurement nodes as a function of time—with the V-START node being near the beginning of the signal line, the V-END node being at the distal end of the signal line, and the V-MID1 and V-MID2 nodes being between the V-START node and the V-END node the timing diagram 101 in FIG. 1 illustrates that the target condition at the V-END node (e.g., V-END=V-INPUT=VT) is achieved at time T1 only after a delay of D1.

Typically, no operation can be performed until the entire signal line is properly biased, and thus memory operations must wait until every point along the signal line is at the target condition. With increasing storage density—and therefore increasing signal line length—the propagation delay may lead to unacceptable delays in performing operations on the memory cells at increasing operating frequencies and may cause a bottleneck in memory system timing. Therefore, attempts have been made to decrease the time needed to achieve the target condition along signal lines prior to a memory operation.

For example, a biasing signal may be preemphasized for some finite period of time, and then the biasing signal may be reduced to a target voltage for the signal line after that initial period of time. Preemphasizing the biasing signal may speed the propagation of a biasing voltage along the signal line, and may therefore allow memory operations to be performed sooner than would otherwise be the case.

Typically, however, little to no control is exerted on the magnitude and duration of the preemphasis of the biasing signal, which can lead to wasted power and less than optimal results.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 2:
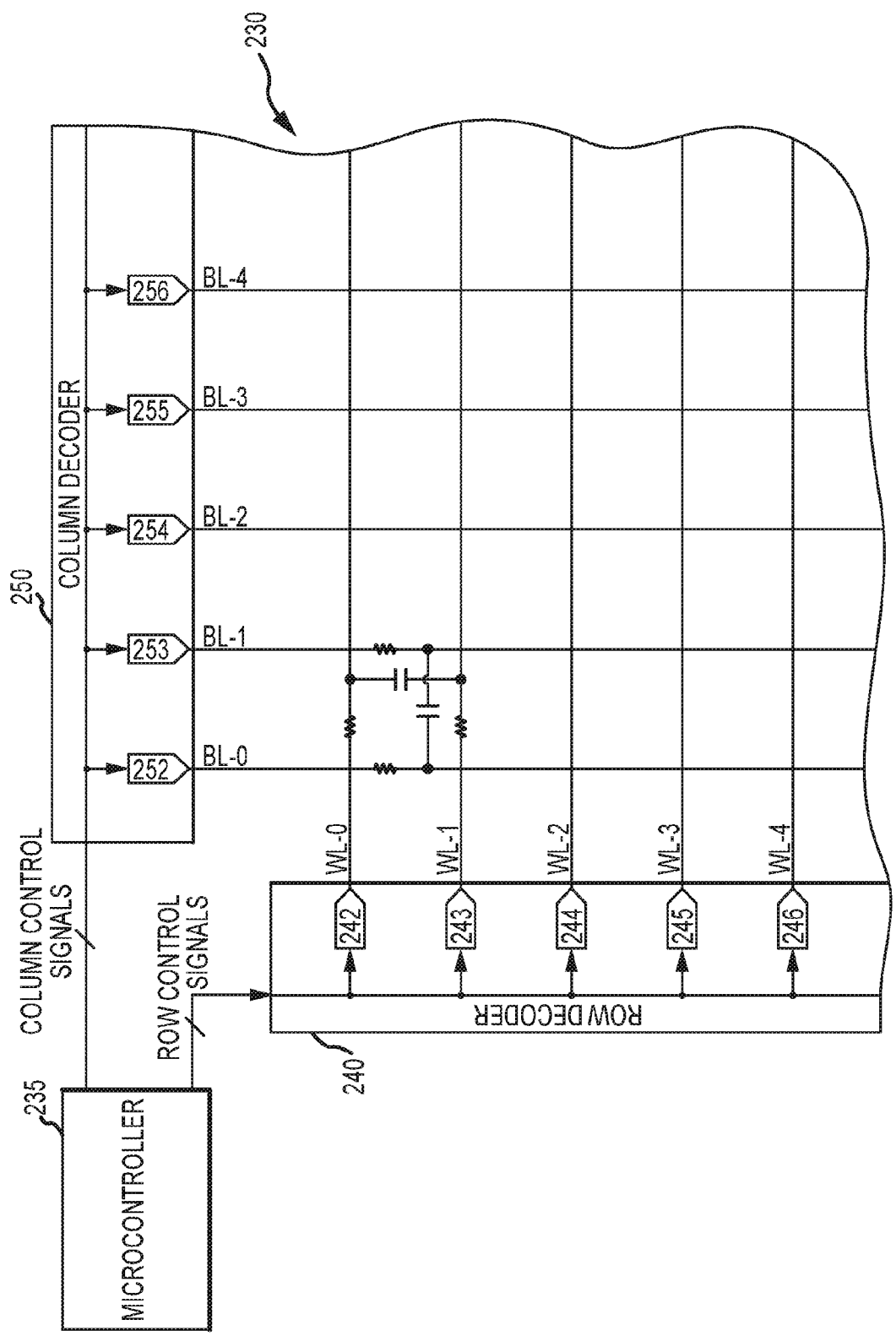
FIG. 2 is a simplified schematic diagram of a memory array according to an embodiment of the present invention.

FIG. 2 illustrates an apparatus including a memory array 230 according to an embodiment of the invention. As used herein, apparatus may refer to, for example, an integrated circuit, a memory device, a memory system, an electronic device or system, a smart phone, a tablet, a computer, a server, etc. The memory array 230 includes a plurality of signal lines including both word lines WL-0, WL-1, WL-2, WL-3, WL-4 and bit lines BL-0, BL-1, BL-2, BL-3, BL-4. A plurality of individual or groups of memory cells (not specifically illustrated in FIG. 2) of the memory array 230 are accessible through the word lines WL-0, WL-1, WL-2, WL-3, WL-4 and bit lines BL-0, BL-1, BL-2, BL-3, BL-4. Data may be read from or written (including programming and/or erasing) to the memory cells. The memory cells may be non-volatile (e.g., NAND flash) in some examples, or may be volatile (e.g., DRAM) in other examples. Each memory cell stores one or more bits of information. In some embodiments, the memory array 230 is a cross-point array.

Figure 3:
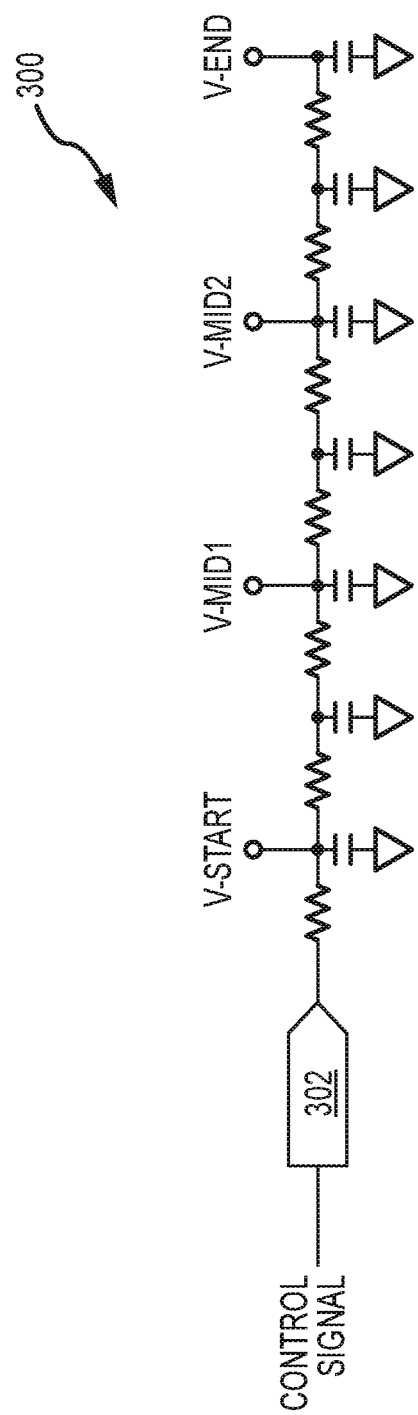
FIG. 3 is a simplified schematic diagram of a model of a signal line according to an embodiment of the present invention.

A row decoder 240 is coupled to the plurality of word lines WL-0, WL-1, WL-2, WL-3, WL-4, with respective signal line drivers 242, 243, 244, 245, 246 biasing each of the respective word lines WL-0, WL-1, WL-2, WL-3, WL-4. A column decoder 250 is coupled to the plurality of bit lines BL-0, BL-1, BL-2, BL-3, BL-4, with respective signal line drivers 252, 253, 254, 255, 256 biasing each of the respective bit lines BL-0, BL-1, BL-2, BL-3, BL-4. As illustrated in part in FIG. 2, and as also illustrated in FIG. 3 as described below, there may be some capacitive coupling between the word lines WL-0, WL-1, WL-2, WL-3, WL-4 and bit lines BL-0, BL-1, BL-2, BL-3, BL-4, and each signal line may also be resistive. At the terminuses of each respective signal line, the signal lines may be modeled as lumped resistance-capacitance (RC) circuits, or, the signal lines may be modeled as distributed RC circuits.

A microcontroller 235 provides a plurality of column control signals to the column decoder 250, which in turn provides individual control signals to each of the signal line drivers 252, 253, 254, 255, 256 in order to bias the respective bit lines BL-0, BL-1, BL-2, BL-3, BL-4. The microcontroller 235 also provides a plurality of row control signals to the row decoder 240, which in turn provides control signals to each of the signal line drivers 242, 243, 244, 245, 246 in order to bias the respective word lines WL-0, WL-1, WL-2, WL-3, WL-4.

The microcontroller 235 may provide the control signals to the row decoder 240 and the column decoder 250 in many different manners. For example, the microcontroller 235 may be a state machine that, upon receiving commands such as read, program, erase, etc., determines which biasing signals need to be provided to which signal lines at which biasing levels. The biasing signals that need to be provided to the signal lines WL-0, WL-1, WL-2, WL-3, WL-4, BL-0, BL-1, BL-2, BL-3, BL-4 may depend not only on an operation command that is received in the microcontroller 235, but may also be responsive to one or more operating conditions, as described below in more detail.

In order to access the memory cells and perform an operation on one or more cells of the memory array 230, one or more of the signal lines WL-0, WL-1, WL-2, WL-3, WL-4, BL-0, BL-1, BL-2, BL-3, BL-4 may need to be biased in order to achieve one or more target conditions on the respective signal lines WL-0, WL-1, WL-2, WL-3, WL-4, BL-0, BL-1, BL-2, BL-3, BL-4. As one example, in order to read memory cells in a NAND flash memory, a word line to be read needs to be biased to a "read" voltage, and one or more other signal lines need to be biased to a "select" voltage or some other voltage. Of course, different NAND flash configurations may require more or fewer target conditions on various signal lines, and various operations (e.g., read, write, program, erase, verify read, etc.) on other types of memory may require many different types of target conditions for various signal lines. Generally speaking, a target condition may be any characteristic associated with a signal line—for example, the signal line may be required to have a certain voltage present along the length of the signal line, the signal line may be required to sustain a certain current, or the signal line may be required to have a certain resistance or a certain capacitance, and so forth.

The microcontroller 235 may include one or more lookup tables that store information regarding which control signals should be provided to which signal line drivers (the control signals being responsive to certain operating conditions) in order to provide a biasing signal that permits certain operations to be performed. In other embodiments, the microcontroller 235 may, in place of lookup tables, individually calculate which control signals should be provided to which signal line drivers responsive to certain operating conditions in order to perform certain operations. In some examples and with reference to FIG. 2, the microcontroller 235 may provide control signals indicative of the desired biasing voltages in the form of digital signals to the signal line drivers 242, 243, 244, 245, 246, 252, 253, 254, 255, 256 in the row decoder 240 and the column decoder 250 in some embodiments, whereas in other embodiments, the microcontroller 235 provides analog signals to the signal line drivers 242, 243, 244, 245, 246, 252, 253, 254, 255, 256. Generally, any type of microcontroller 235 can be used to generate the control signals.

Each of the signal line drivers 242, 243, 244, 245, 246 252, 253, 254, 255, 256 is configured to provide a biasing signal to its respective signal line responsive to one or more control signals received from the microcontroller 235. The control signals may determine the characteristics of the biasing signal provided to a signal line—for example, the magnitude of a biasing voltage or current as a function of time. As explained in more detail below, the control signals may determine the duration (e.g., width), shape, and magnitude of a preemphasis of the biasing signal and may be adaptively provided. responsive to one or more operating conditions.

In one example, each signal line driver 242, 243, 244, 245, 246, 252, 253, 254, 255, 256 includes or is coupled to a digital to analog converter (DAC) that, in turn, includes or is coupled to a voltage source. In this example, the column and row control signals provided by the microcontroller 235 may be digitally synthesized representations of biasing signals—here, biasing voltages—to be provided to the signal lines. In other examples, one or more of the signal line drivers 242, 243, 244, 245, 246, 252, 253, 254, 255, 256 may alternatively or additionally include one or more current sources configured to bias a signal line with a biasing current, At least some of the biasing signals provided by the signal line drivers 242, 243, 244, 245, 246, 252, 253, 254, 255 may be selectively preemphasized. The period of time the biasing signal is preemphasized may be referred to as a preemphasis or a preemphasis pulse, which may have a certain duration, a certain shape, and/or a certain magnitude as a function of time.

Preemphasizing, as used herein, includes providing the biasing signal at a different level as compared with a target condition associated with a particular operation to be performed on a signal line. The level may be a magnitude, which may be greater or less than a magnitude of the target condition. The target condition may be a desired voltage, a desired current, and so forth. As one example of a preemphasis, the signal line drivers 242, 243, 244, 245, 246, 252, 253, 254, 255, 256 may selectively "preemphasize" the biasing signal by providing the biasing signal at a magnitude greater than the magnitude of a target condition for the signal line WL-0, WL-1, WL-2, WL-3, WL-4, BL-0, BL-1, BL-2, BL-3, BL-4 associated with a particular operation for some duration of time. If the target condition for reading a particular signal line is that a voltage of VT must be present along the length of the signal line, the biasing signal may be provided at voltage level VP (where VP is greater than VT) during a first phase by a respective signal line driver responsive to a control signal from the microcontroller 235. In other examples, the signal line drivers 242, 243 244, 245, 246, 252, 253, 254, 255, 256 may provide a preemphasis in current provided to the signal lines WL-0, WL-1, WL-2, WL-3, WL-4, BL-0, BL-1, BL-2, BL-3, BL-4. In general, the signal line drivers 242, 243, 244, 245, 246, 252, 253, 254, 255, 256 provide the biasing signal at some elevated or reduced level as compared to the target condition of a signal line associated with a particular operation.

In one or more subsequent phases, the biasing signal may be reduced to and/or be maintained at VT, the target condition in this particular example. The selective preemphasis of the biasing signal during the initial phase of providing the biasing signal to the signal line may decrease the amount of time needed for the signal line to achieve its target condition of VT along the length of the signal line as compared with if the biasing signal was provided at VT the entire time. In a particular example, VT may be 3.5 volts, VP may be 5.5 volts and the duration of the first phase may be 400 nanoseconds.

The control signals provided by the microcontroller 235 to the signal line drivers 242, 243, 244, 245, 246, 252, 253, 254. 255, 256 may be responsive to one or more operating conditions, and generally determine the duration, magnitude, shape, and so forth of the preemphasis. In some embodiments, the duration and magnitude of preemphasis of the biasing signal is determined in the microcontroller 235 by modeling a signal line as a concentrated or a distributed RC network, considering one or more operating conditions, and calculating a biasing signal that will efficiently and/or quickly bias the signal line to the desired target condition under the one or more operating conditions. This modeling and/or calculating may be done in real-time or in substantially real-time in some but not all embodiments.

The operating conditions considered by the microcontroller 235 in providing the control signals may be operating conditions of the memory array 230, operating conditions of an integrated circuit or electronic device containing the memory array 230, operating conditions more generally (e.g., ambient air temperature), or combinations of the aforementioned operating conditions.

One example of an operating condition that the microcontroller 235 may consider when generating the control signals is the electrical parameters of a signal line (such as the measured or calculated resistance or capacitance). Another example of an operating condition is the operating temperature of an integrated circuit incorporating the memory array 230. As the operating temperature increases, the microcontroller 235 may provide control signals to the signal line drivers 242, 243, 244, 245, 246, 252, 253, 254, 255, 256 indicating that a larger or longer preemphasis should be provided to one or more of the signal lines WL-0, WL-1, WL-2, WL-3, WL-4, BL-0, BL-1, BL-2, BL-3, BL-4 in order to overcome the sluggish propagation of a biasing voltage, for example, due to the increased temperature.

As another example of an operating condition, the supply voltage provided to the memory array 230 may be monitored, and, responsive to changes in the magnitude of the supply voltage provided to the memory array 230, the microcontroller 235 may provide control signals indicative of those variations and/or indicative of ways to counteract those variations.

Additional examples of operating conditions include timing and power constraints. For example, if an integrated circuit that includes the memory array 230 is operating at a reduced frequency (e.g., if it is in a sleep or low power mode, or it is integrated into a mobile device with limited battery, or if the batter powering the integrated circuit is nearly drained), the microcontroller may selectively provide control signals to the signal line drivers 242, 243, 244, 245, 246, 252, 253, 254, 255, 256 that do not preemphasize the biasing signals, or may provide control signals to the signal line drivers 242, 243, 244, 245, 246, 252, 253, 254, 255, 256 that preemphasize less (e.g., smaller magnitude, shorter duration of the preemphasis) as compared with the preemphasis provided in normal operating conditions. Of course if the integrated circuit that includes the memory array 230 is operating at an increased frequency, the microcontroller 235 may provide control signals to the signal line drivers 242, 243, 244, 245, 246, 252, 253, 254, 255, 256 such that the biasing signal is preemphasized more than normal.

As another example of an operating condition that may affect the preemphasis of the biasing signal, process variations between integrated circuit chips during manufacture may be considered. Process variations between integrated circuit chips during manufacture may cause a signal line on one integrated circuit to propagate a voltage faster or slower than a signal line on a different integrated circuit. Therefore, in order to provide a relatively uniform timing across different integrated circuit chips, a feedback mechanism may be included to monitor, for example, the resistance or capacitance of a signal line, and adjust the preemphasis provided to the signal line accordingly. More generally, any type of monitoring may be used to provide feedback to the microcontroller 235 in order to reevaluate the control signals provided to the signal line drivers 242, 243, 244, 245, 246, 252, 253, 254, 255, 256.

Still another example of an operating condition that the microcontroller 235 may use in determining the appropriate preemphasis to provide to a particular signal line is the address of a portion of the memory array 230 that is to be operated on according to the command received at the microcontroller 235. The address may be an address of a single memory cell, the address of a column or a row in the memory array 230, the address of a page or block within the memory array 230, and so forth.

For example, with reference to FIG. 2, if the column of memory cells associated with hit line BL-0 is to be read, and the word lines WL-0, WL-1, WL-2, WL-3, WL-4 associated with each of those memory cells needs to be at a target voltage of VT in order for that read to occur, the biasing signal provided to each of the signal line drivers 242, 243, 244, 245, 246 in the row decoder 240 may not be preemphasized to VP because even a non-preemphasized biasing signal of VT will still cause the target condition of VT to be present on the word lines WL-0, WL-1, WL-2, WL-3, WL-4 proximate the location of the intersection with bit line BL-0 relatively soon after the VT biasing signal is provided by the signal line drivers 242, 243, 244, 245, 246 to the input of each of the respective word lines WL-0, WL-1, WL-2, WL-3, WL-4. In contrast, if the column of memory cells associated with bit line BL-4 is to be read, and the word lines WL-0, WL-1, WL-2, WL-4 associated with each of those memory cells needs to be at a target voltage of VT in order for that read to occur, the biasing signal provided to each of the signal line drivers 242, 243, 244, 245, 246 in the row decoder 240 may be preemphasized to VP for some finite period of time e.g., 400 nanoseconds) because with only a non-preemphasized biasing signal of VT provided to the word lines WL-0, WL-1, WL-2, WL-3, WL-4, it may be some time later before the target condition of VT is achieved on the word lines WL-0, WL-1, WL-2, WL-3, WL-4 proximate the memory cells associated with bit line BL-4. Continuing with this example, if the column of memory cells associated with bit line BL-2 is to be read, a smaller magnitude of preemphasis (e.g. between VT and VP) may be provided to each of the word lines WL-0, WL-1, WL-2, WL-3, WL-4. In general, the microcontroller 235 may decode the address of a memory command and determine whether or not to provide control signals to the signal line drivers 242, 243, 244, 245, 246, 252, 253, 254, 255, 256 indicating that a preemphasis should be provided, and the control signals may also determine the magnitude of the preemphasis as a function of time.

For multi-level memory cells, one other example of an operating condition that may be considered by the microcontroller 235 is to which level one or more memory cells are to be programmed. For example, if a memory cell can be programmed to 4 different states (and may store two bits of data), and the level to which the memory cell is programmed depends on whether the voltage present on the signal line associated with the cell during the programming of the cell is Va, Vb, Vc, or Vd, where Va<Vb<Vc<Vd, the microcontroller 235 may provide control signals to the signal line drivers indicating a relatively large and/or long preemphasis when Vd is to be provided, a smaller and/or shorter preemphasis when Vc is to be provided, a still smaller and/or shorter preemphasis when Vb is to be provided, and no preemphasis when Va is to be provided.

In general, the microcontroller 235 may provide the control signals to the signal line drivers 242, 243, 244, 245, 246, 252, 253, 254, 255, 256 responsive to one or more of any type of operating condition.

The operating condition(s) that the microcontroller 235 considers may be determined during an initial setup (e.g., calibration) of the memory array 230 and/or periodically during operation—for example, every 10 seconds the operating conditions may be monitored and the appropriate control signals reevaluated. In one example, reevaluation of the control signals may be triggered by a feedback mechanism for example if the memory array 230 is consistently producing errors in the data written to or read from the memory cells, a feedback signal may trigger the reevaluation of the control signals, which may in turn effect the biasing signals provided by the signal line drivers 242, 243, 244, 245, 246, 252, 253, 254, 255, 256 to the signal lines WL-0, WL-1, WL-2, WL-3, WL-4, BL-0, BL-1, BL-2, BL-3, BL-4. In other examples, the control signals may depend on which command has been provided to the microcontroller 235 to execute, or the address of a memory cell or row/column that is to be read from or written to.

In general, the microcontroller 235 may determine the control signals based on, among other things, physical properties of the signal lines WL-0, WL-1, WL-2, WL-3, WL-4, BL-0, BL-1, BL-2, BL-3, BL-4, previous observations made during testing of the memory array 230, contemporaneous observations of the memory array 230, command type (user read, verify read, write, program, erase, etc.) and memory cell address of a current or future command, trial and error, and so forth.

Controlling the magnitude, duration, shape, and type of preemphasis provided by the signal line drivers 242, 243, 244, 245, 246, 252, 253, 254, 255, 256 to their respective signal lines may help reduce power consumption as compared with memory arrays where the signal lines are always preemphasized. Controlling the preemphasis may also help in optimizing the extra power and other resources needed to preemphasize signal lines WL-0, WL-1, WL-2, WL-3, WL-4, BL-0, BL-1, BL-2, BL-3, BL-4 in order to be efficient in performing memory operations in the memory array 230.

FIG. 3 illustrates a simplified model 300 of a signal line according to an embodiment of the invention. The signal line 300 includes a signal line driver 302, which may be similar to the signal line drivers 242, 243, 244, 245, 246, 252, 253, 254, 255, 256 described above with reference to FIG. 2. The model 300 includes distributed capacitances and resistances, with a plurality of measurement nodes illustrated for later discussion relating to the timing diagram of FIG. 5. A biasing signal is provided by the signal line driver 302 to the signal line 300, which propagates a voltage down the signal line 200 to measurement nodes V-START, V-MID1, V-MID2, and finally V-END. The measurement node V-START is relatively close to the signal line driver 302, and the measurement node V-END is on the opposite end of the signal line 300 than the signal line driver 302. Measurement nodes V-MID1 and V-MID2 are approximately one third and two thirds, respectively, of the physical distance from measurement nodes V-START to measurement node V-END.

Figure 4A:
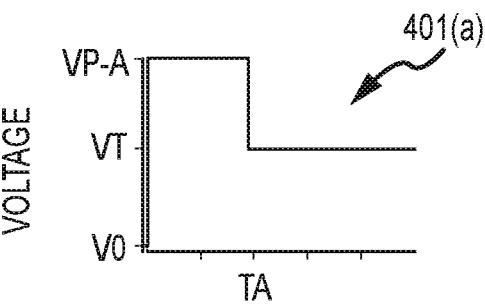
FIGS. 4A through 4D are timing diagrams for a biasing voltage that may be provided to the model signal line of FIG. 3 according to an embodiment of the present invention.
Figure 4B:
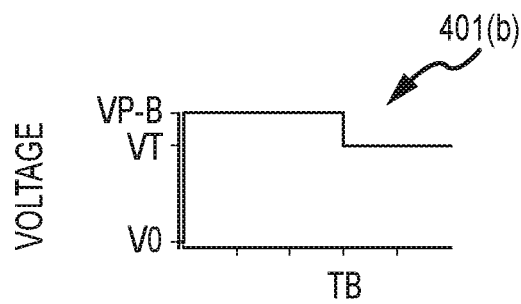
Figure 4C:
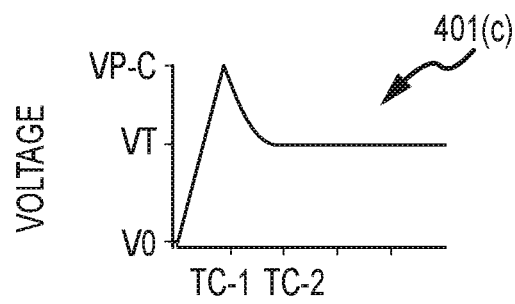
Figure 4D:
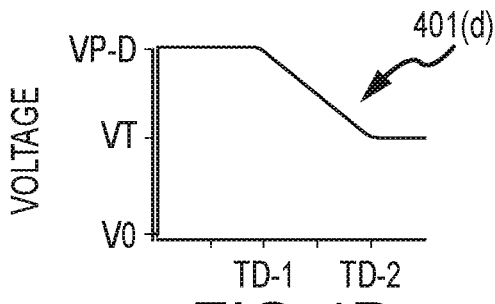

FIGS. 4A through 4D are sample timing diagrams 401(*a*), 401(*b*), 401(*c*), 401(*d*) of a biasing voltage that may be provided to the model signal line 300 illustrated in FIG. 3 according to an embodiment of the invention. In each of FIGS. 4A through 4D, the biasing signal provided to the input of signal line 300 includes a preemphasis, and, following the preemphasis, the biasing signal is reduced to VT, which may be the target voltage condition required on signal line 300 for a particular memory operation to be performed. In FIG. 4A, the biasing signal is preemphasized to approximately VP-A until time TA. The shape of the preemphasis is a generally square pulse. In a particular example, VT may be 3.5 volts, VP-A may be 7.0 volts, and time TA may be 400 nanoseconds. In FIG. 4B, the shape is still square, but the magnitude of the preemphasis is only VP-B (with VP-B being less than VP-A) and the preemphasis being provided for a longer period of time, until time TB (with TB being greater than TA). In a particular example, VP-B may be 5.0 volts and time TB may be 600 nanoseconds. In FIG. 4C, the preemphasis of the biasing signal increases from V0 to VP-C linearly until time TD-1, and then generally linearly decreases to VT until time TC-2. In a particular example, VP-C is 7 volts, TC-1 is 200 nanoseconds, and TC-2 is 400 nanoseconds. In FIG. 4D, the biasing signal is preemphasized to VP-D initially, but at approximately TD-1 begins to decrease linearly to VT until time TD-2. Although FIGS. 4A through 4D have illustrated several different types of preemphasis that may be provided, the preemphasis may generally take many other forms. For example, the preemphasis maybe stepped in that the preemphasis is provided at a first magnitude for a first period of time, and then the preemphasis is provided at a second magnitude for a second period of time, after which the biasing signal is provided at the target voltage.

Figure 5:
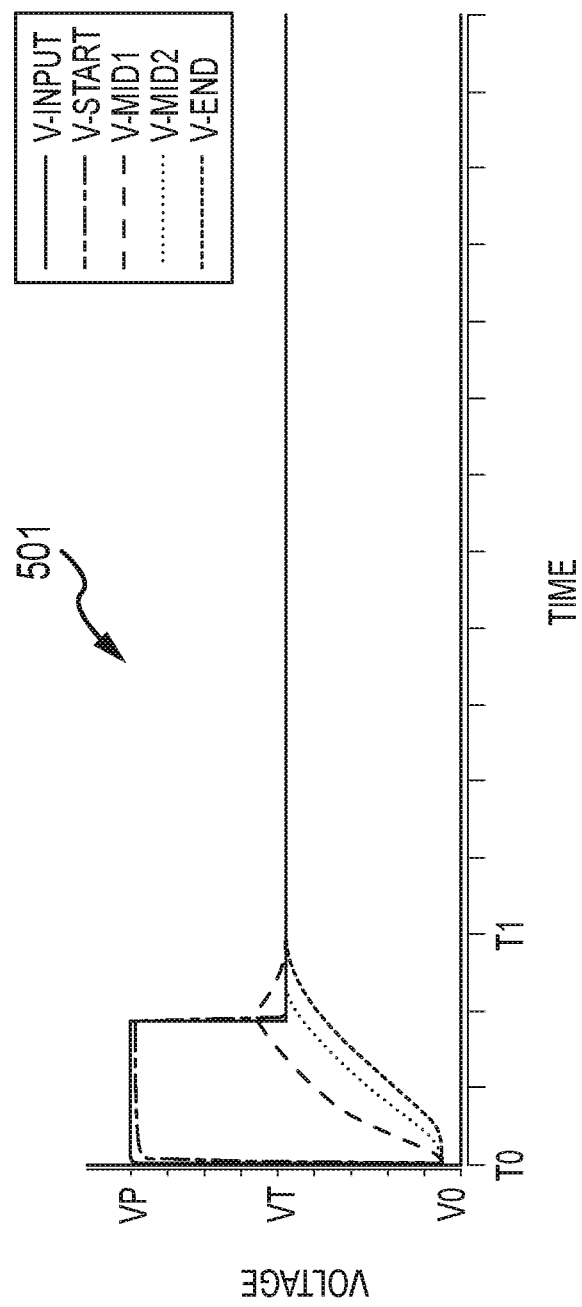
FIG. 5 is a timing diagram for the model signal line of FIG. 3 according to an embodiment of the present invention.

FIG. 5 is a timing diagram 501 illustrating a biasing signal V-INPUT provided to the input of the model signal line 300 of FIG. 3 according to an embodiment of the invention. The biasing signal V-INPUT in FIG. 5 corresponds with the biasing signal 401(*a*) illustrated in FIG. 4A. With reference back to FIG. 3, the voltage along signal line 300 is measured at several nodes V-START, V-MID1, V-MID2, and V-END. The voltage at node V-START, near the input of the signal line 300, is generally similar to the biasing signal V-INPUT provided to the input of the signal line 300 because the voltage propagates relatively quickly to that node. Specifically, the voltage at node V-START increases rapidly to nearly VP, and then drops quickly to VT within a few nanoseconds of V-INPUT dropping to VT.

The voltage at the middle nodes V-MID1 and V-MID2 also increases responsive to the preemphasis, but increases more slowly than the voltage at node V-START due to the propagation delay induced by the RC characteristics of the signal line 300. The voltage at node V-MIDI increases above the target voltage of VT for several hundred nanoseconds, and then settles down to VT at approximately time T1. In some embodiments, the signal line may not be ready for a memory operation until such overshoots at various nodes of the signal line 300 have settled down to the target condition for the signal line.

Figure 1:
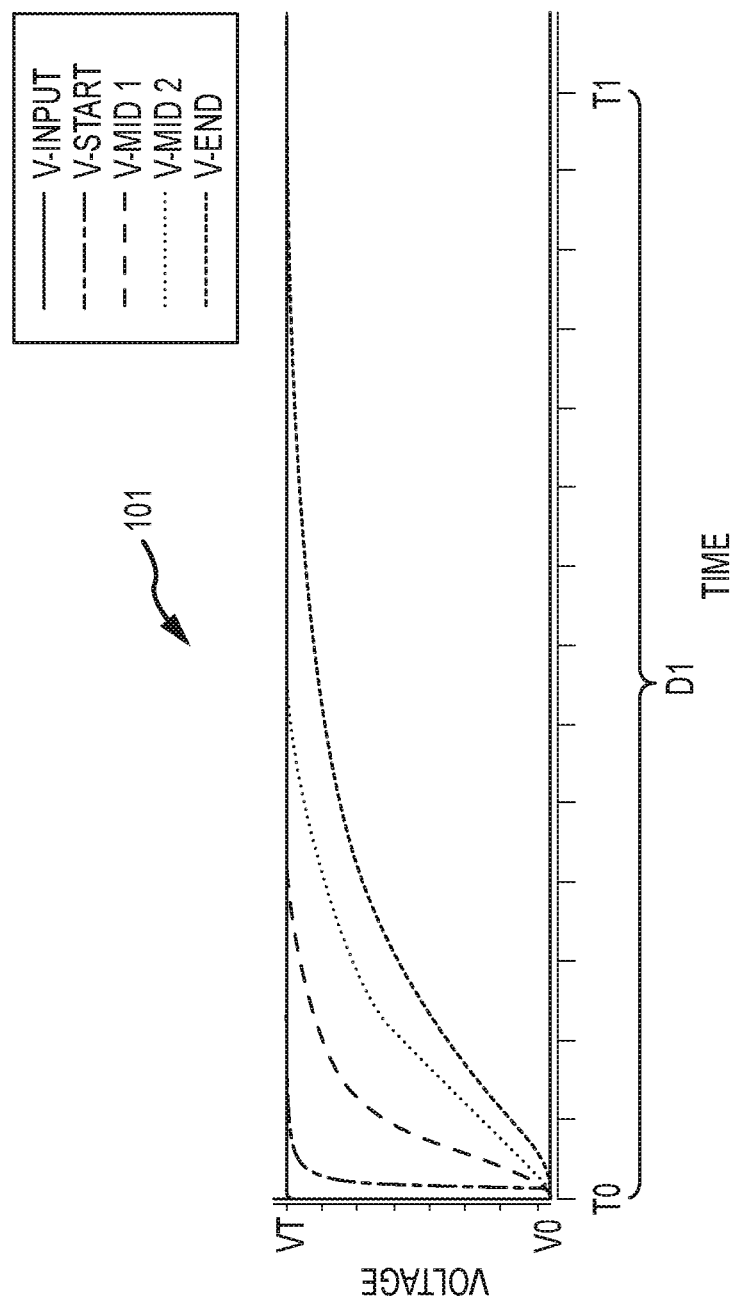
FIG. 1 is a timing diagram of a signal line in a prior art memory.

As illustrated in FIG. 5, the voltage at the node V-END is the slowest rise to the target voltage, and in FIG. 5 achieves the target voltage at approximately time T1 in FIG. 5, which may be much less than time T1 in FIG. 1. At time T1, each of the nodes V-START, V-MID1, V-MID2, and V-END are at the target condition of VT and ready for performance of a memory operation.

Figure 6:
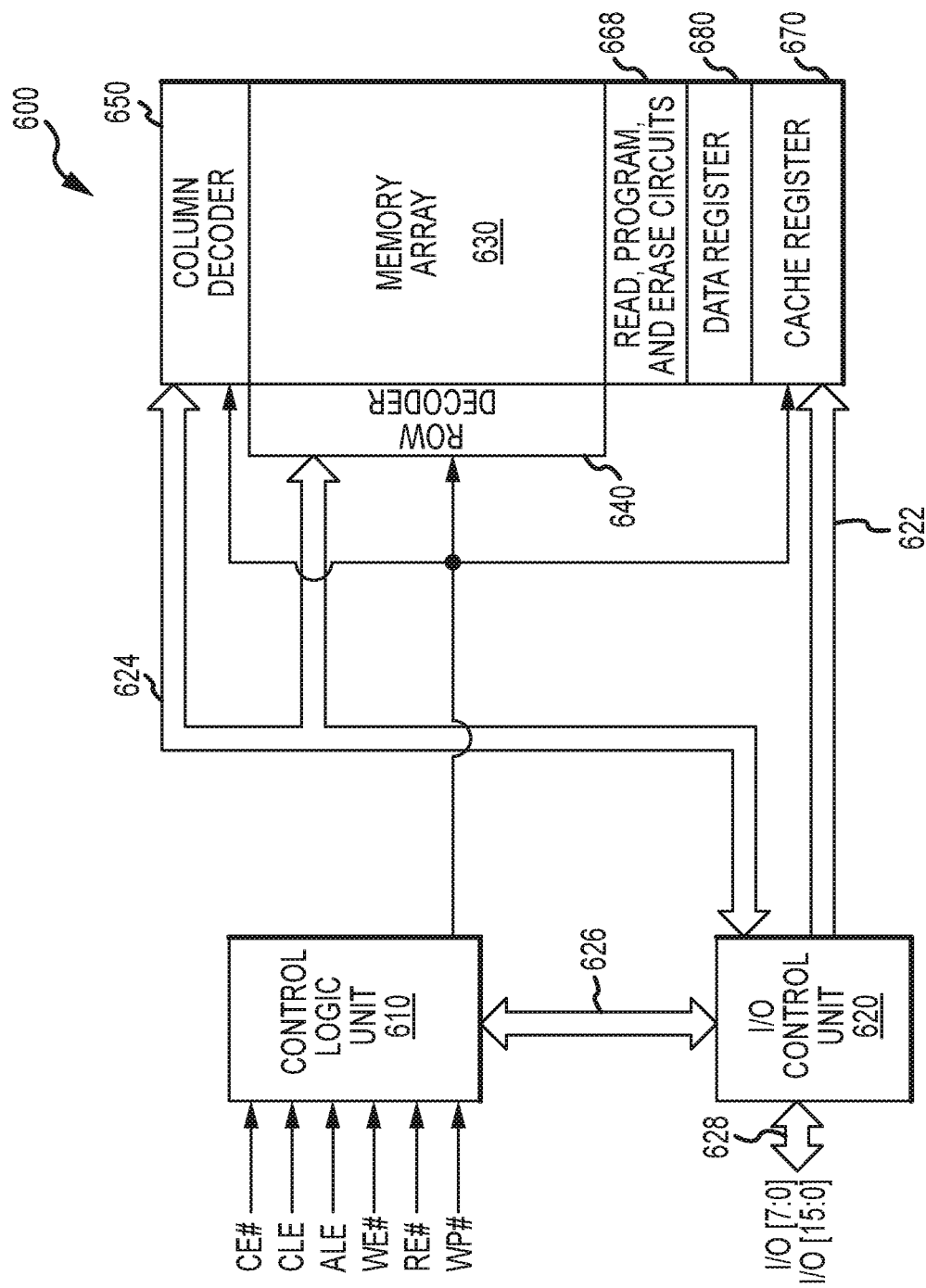
FIG. 6 is a block diagram of a memory according to an embodiment of the invention.

FIG. 6 illustrates a memory 600 according to an embodiment of the present invention. The memory 600 includes a memory array 630 with a plurality of memory cells. The memory cells may be non-volatile memory cells, such as NAND flash cells, or may generally be any type of memory cells.

Command signals, address signals and write data signals may be provided to the memory 600 as sets of sequential input/output ("I/O") signals transmitted through an I/O bus 628. Similarly, read data signals may be provided from the memory 600 through the I/O bus 628, The I/O bus 628 is connected to an I/O control unit 620 that routes the signals between the I/O bus 628 and an internal data bus 622, an internal address bus 624, and an internal command bus 626. The memory 600 also includes a control logic unit 610 that receives a number of control signals either externally or through the command bus 626 to control the operation of the memory 600.

The address bus 624 applies block-row address signals to a row decoder 640 and column address signals to a column decoder 650. The row decoder 640 and column decoder 650 may be used to select blocks of memory or memory cells for memory operations, for example, read, program, and erase operations. The row decoder 640 and/or the column decoder 650 may include one or more signal line drivers configured to provide a biasing signal to one or more of the signal lines in the memory array 630, as described above with reference to FIGS. 2 through 5. The column decoder 650 may enable write data signals to be applied to columns of memory corresponding to the column address signals and allow read data signals to be coupled from columns corresponding to the column address signals.

In response to the memory commands decoded by the control logic unit 610, the memory cells in the array 630 are read, programmed, or erased. Read, program, and erase circuits 668 coupled to the memory array 630 receive control signals from the control logic unit 610 and include voltage generators for generating various pumped voltages for read, program and erase operations. In addition to the signal line drivers in the row decoder 640 and/or column decoder 650, one or more of the voltage generators or other read, program, and erase circuits 668 may also include signal line drivers, as described above with reference to FIGS. 2 through 5.

After the row address signals have been applied to the address bus 624, the I/O control unit 620 routes write data signals to a cache register 670. The write data signals are stored in the cache register 670 in successive sets each having a size corresponding to the width of the I/O bus 628. The cache register 670 sequentially stores the sets of write data signals for an entire row or page of memory cells in the array 630. All of the stored write data signals are then used to program a row or page of memory cells in the array 630 selected by the block-row address coupled through the address bus 624. In a similar manner, during a read operation, data signals from a row or block of memory cells selected by the block-row address coupled through the address bus 624 are stored in a data register 680. Sets of data signals corresponding in size to the width of the I/O bus 628 are then sequentially transferred through the I/O control unit 620 from the data register 680 to the I/O bus 628.

In some embodiments, the memory array 630 may be a cross-point array. The cross-point array 630 may be divided into one or more tiles. Providing an adaptable preemphasis to respective signal lines within one or more tiles of the cross-point array 630 —and thereby decreasing the delays involved in biasing signal lines —may allow relatively large tiles to be used without adversely affecting the access time for performing memory operations. In some cross-point array 630 implementations, a single microcontroller and/or a single set of signal line drivers may be associated with and provide biasing signals to a plurality of tiles, whereas in other implementations, each tile may be coupled to and associated with a separate microcontroller and set of signal line drivers.

From the foregoing it will be appreciated that, although specific embodiments of the invention have been described herein for purposes of illustration, various modifications may be made without deviating from the spirit and scope of the invention. For example, FIG. 2 illustrates embodiments of circuits such as a memory array 230, a row decoder 240, a column decoder 250, signal line drivers 242, 243, 244, 245, 246, 252, 253, 254, 255, 256, and a microcontroller 235. However, other memory arrays, row decoders, column decoders, signal line drivers, microcontrollers and so forth may be used, which are not limited to having the same design, and may be of different designs and include circuitry different from the circuitry in the embodiments illustrated in these figures. As another example although FIG. 6 illustrates an example of a non-volatile memory, many other types of memories may include signal line drivers, such as those described above with reference to FIGS. 2 through 5 including DRAM, PCRAM, RRAM, CBRAM, MVO, PCMO, SRAM, and so forth.

Accordingly, the invention is not limited except as by the appended claims.

What is claimed is:
1. An apparatus, comprising:
 a memory array including a signal line coupled to a plurality of memory cells and configured to provide access to the plurality of memory cells responsive to a biasing condition of the signal line; and
 a signal line driver coupled to the signal line, the signal line driver configured to provide a biasing signal to the signal line, wherein the biasing signal is preemphasized according to a model of the signal line as a concentrated or a distributed RC network.
2. The apparatus of claim 1, further comprising:
 a microcontroller coupled to the signal line driver, the microcontroller configured to control the signal line driver and calculate the biasing signal based at least in part on operating conditions of the memory array.
3. The apparatus of claim 2 wherein the microcontroller is configured to model the signal line as the concentrated or the distributed RC network to calculate the biasing signal.
4. The apparatus of claim 1 wherein the signal line comprises a word line and the signal driver is included in a row decoder.
5. An apparatus, comprising:
 a memory array including a plurality of memory cells and a signal line coupled to the plurality of memory cells;
 a signal line driver coupled to a signal line of a memory array, the signal line driver configured to provide a biasing signal to the signal line; and
 a microcontroller coupled to the signal line driver, the microcontroller configured to control the signal line driver to preemphasize the biasing signal according to a model of the signal line as a concentrated or a distributed RC network.
6. The apparatus of claim 5 wherein the microcontroller is configured to calculate electrical parameters of the concentrated RC network or the distributed RC network.
7. The apparatus of claim 5 wherein the electrical parameters comprise a calculated resistance or a calculated capacitance.
8. The apparatus of claim 5 wherein the concentrated RC network comprises a lumped resistance-capacitance (RC) circuit.

9. The apparatus of claim 5 wherein the microcontroller is configured to calculate the biasing signal based at least in part on at least one operating condition of the memory array.

10. The apparatus of claim 9 wherein the at least one operating condition of the memory array is determined in an initial setup of the memory array.

11. The apparatus of claim 9 wherein the memory array is a cross-point array.

12. The apparatus of claim 9, wherein the at least one operating condition comprises a power constraint of the memory array.

13. The apparatus of claim 12, wherein the power constraint corresponds to at least one of a sleep mode, a low power mode, or an operation of the memory array in conjunction with a drained battery.

14. The apparatus of claim 9, wherein a duration, magnitude, shape, or combinations thereof of the biasing signal is based on the at least one operating condition.

15. The apparatus of claim 9, wherein the operating condition comprises multi-level of programming of at least two memory cells of the plurality of memory cells, the multi-level programming comprising a plurality of states for each level of the at least two memory cells.

16. The apparatus of claim 9, wherein the operating condition comprises process variations of the memory array.

17. A method, comprising:
modeling a signal line as a concentrated or a distributed RC network, the signal line coupled to a plurality of memory cells; and
calculating a biasing signal based on the modeled signal line and at least one operating condition; and
preemphasizing the biasing signal based on the calculation of the biasing signal.

18. The method of claim 17 wherein calculating a biasing signal based on the modeled signal line and at least one operating condition comprises calculating the electrical parameters of the signal line, the electrical parameters comprising a calculated resistance or calculated capacitance.

19. The method of claim 17 further comprising:
providing the biasing signal to the signal line to preemphasize signal line during a memory operation.

20. The method of claim 19 wherein providing the biasing signal to the signal line comprises adaptively providing the biasing signal responsive to the at least one operating condition.

* * * * *